(12) United States Patent
Baier

(10) Patent No.: US 8,844,916 B2
(45) Date of Patent: Sep. 30, 2014

(54) DEVICE AND METHOD FOR PROCESSING FLAT SUBSTRATES SUCH AS FOR PRINTING CIRCUIT BOARDS OR THE LIKE

(75) Inventor: Georg Baier, Berwangen (DE)

(73) Assignee: Ekra Automatisierungssysteme GmbH, Boennigheim (DE)

( * ) Notice: Subject to any disclaimer, the term of this patent is extended or adjusted under 35 U.S.C. 154(b) by 1064 days.

(21) Appl. No.: 12/594,446

(22) PCT Filed: Mar. 26, 2008

(86) PCT No.: PCT/EP2008/002381
§ 371 (c)(1),
(2), (4) Date: Oct. 2, 2009

(87) PCT Pub. No.: WO2008/125186
PCT Pub. Date: Oct. 23, 2008

(65) Prior Publication Data
US 2010/0061832 A1   Mar. 11, 2010

(30) Foreign Application Priority Data

Apr. 13, 2007   (DE) .......................... 10 2007 017 486

(51) Int. Cl.
*B23Q 3/04*   (2006.01)
*H05K 3/12*   (2006.01)

(52) U.S. Cl.
CPC .................................. *H05K 3/1216* (2013.01);
*H05K 2203/0165* (2013.01)
USPC .............................................. 269/55; 269/60

(58) Field of Classification Search
USPC ........... 269/55, 60, 71, 48.1, 289 R, 309–310
See application file for complete search history.

(56) References Cited

U.S. PATENT DOCUMENTS

| 6,015,247 | A | * | 1/2000 | Branaman ..................... 408/1 R |
| 6,029,966 | A | * | 2/2000 | Hertz et al. .................... 269/266 |
| 6,264,187 | B1 | * | 7/2001 | Hertz et al. .................... 269/266 |
| 6,695,298 | B1 | * | 2/2004 | Hertz et al. .................... 269/266 |
| 6,726,195 | B1 | * | 4/2004 | Hertz et al. .................... 269/266 |
| 7,396,005 | B2 | * | 7/2008 | Berset et al. ................... 269/216 |
| 7,971,864 | B2 | * | 7/2011 | Kato ................................ 269/43 |
| 2009/0026679 | A1 | * | 1/2009 | Harman, III .................... 269/43 |
| 2010/0061832 | A1 | * | 3/2010 | Baier ........................ 414/225.01 |

FOREIGN PATENT DOCUMENTS

DE   101 17 873 A1   11/2002
EP   0 915 643 A1   5/1999

* cited by examiner

*Primary Examiner* — Lee D Wilson
(74) *Attorney, Agent, or Firm* — Scully, Scott, Murphy & Presser, P.C.

(57) ABSTRACT

A device and a method for processing flat substrates, such as circuit boards or the like to be printed, is provided. The substrate can be fed resting on a transport device on two opposite side edge regions, can be first lifted from below for the purpose of processing through supports and pressed against corresponding hold-down pieces in the side edge regions, and can be clamped on the corresponding side edges of the substrate in this position, resting on the supports, between two clamping strips, whereupon the hold-down piece can be lowered to the side away from the substrate and the clamping strip and further below the region of the upper side of the substrate thus loaded, such that full-surface processing can take place.

7 Claims, 1 Drawing Sheet

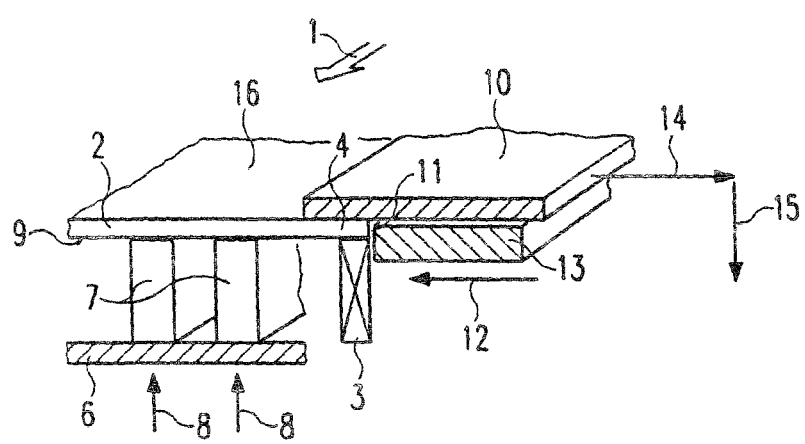

DEVICE AND METHOD FOR PROCESSING FLAT SUBSTRATES SUCH AS FOR PRINTING CIRCUIT BOARDS OR THE LIKE

BACKGROUND

The invention relates to a device as well as to a method for processing flat substrates such as for printing circuit boards or the like.

To enable a flat substrate to be processed, it has to be disposed in the device in a certain position. When doing so, it is particularly important that the surface of the substrate which is to be processed is flat and without any warps, bend-ups or the like. This is particularly important when printing circuit boards by means of the usual printing devices (using screen printing).

Typically, the flat substrate is fed into the device by means of a transport device by two oppositely facing lateral edge areas, is processed there and is transported away after processing by means of a similar transport device (cp. e.g. DE 101 17 873 A1). In the case of somewhat thicker substrates, in particular circuit boards having a high inherent rigidity, it may occur that the corner areas bend upwards and/or that, particularly in the case of loaded or partially loaded circuit boards, some transverse or longitudinal warpage is present in the flat substrate supplied. In order to enable the processing, in particular the printing to be carried out, such bend-ups or warpages need to be removed. To this end the supplied substrate, once it reaches the processing position, is moved in the device from the bottom upwards by means of supports against lateral hold-downs, whilst the warpage or bend-up is compensated by means of the pressure applied. In this position, corresponding clamping bars will then be moved against the oppositely facing lateral edges, with the clamping force being sufficient to keep the inherently rigid substrate between them, and this in such a way that the warps and bend-ups mentioned will not reappear even after the hold-downs have been removed. Subsequently, the processing, for example the printing process, will be carried out. If the hold-downs are completely removed from the area of the substrate, a printing process even across the entire surface may be carried out.

In the case of thinner substrates having a comparatively low inherent rigidity, the above-mentioned problems will not occur, but the application of clamping forces would rather result in a bending of the substrate. According to the DE 101 17 873 A1, the substrate transported to the processing position will initially be deposited on supports by its edges and any clamping bars provided will essentially not be used for applying a clamping force, which of course is to be avoided, but for a lateral alignment and for retaining its position. Here, too, the flat substrate will then typically be supported by means of supports moving from the bottom upwards, but it cannot be entirely processed, particularly not be printed across its entire surface.

Therefore there is a need, also in the case of thin substrates where clamping forces may be applied, if necessary, only to a very minor extent, preferably not at all, to enable flat substrates to be processed or printed across their entire surface, whilst their flat disposal is maintained.

SUMMARY

It is thus the object of the present invention to provide a device and a method by means of which the entire surface of flat substrates may be processed, even if the substrates are thin.

The invention is further developed by means of the features of the dependent claims.

It will be seen that the approach according to the present invention will not only allow thin flat substrates, but also thicker flat substrates to be processed, where the clamping bars may in the case of thin substrates only have a guiding function, but in the case of thick substrates may also have a clamping function. If desired, this may be designed to be automatically controlled.

BRIEF DESCRIPTION OF THE DRAWINGS

The invention will be explained in more detail below by means of the embodiment example which is schematically illustrated in the single FIGURE of the drawing.

DETAILED DESCRIPTION OF EXEMPLARY EMBODIMENTS

The FIGURE shows a schematic view of an edge area of a substrate 2 such as a circuit board, which is fed to a processing position of the device as per the arrow 1. The substrate 2 has been moved into the processing position by means of a transport device 3, which is not explained in more detail and which may be of a design per se known, for example from DE 101 17 873 A1. As shown, a lateral edge area 4 of the substrate 2 rests on transport means of the transport device 3 and has been transported in this way to the processing position.

It is to be mentioned that the opposite lateral edge area of the substrate 2 is handled in the same way, which means that the device is designed mirror-symmetrically there.

By means of, for example, supports 7 located on a cross-table top 6 of the processing device, which may be moved upwards during the transport process from a resting position as per the arrow 8, the entire substrate 2 will be moved upwards upon applying the supports 7 to the underside 9 of the substrate 2, until the lateral edge area 4 rests against a hold-down 10 in the lateral edge area. The lateral edge 11 of the substrate 2 in the lateral edge area 4 and a clamping bar 13 which is movable as per the arrow 12 are brought into contact with each other, and subsequently the hold-down 10 is moved as per the arrow 14 away from the substrate 2 and the extension range of the clamping bar 13 and is subsequently moved downwards as per the arrow 15 in such a way that the top surface 16 of the substrate 2 is the surface located at the highest level, whereupon the processing, in particular the printing will be initiated, so that processing, particularly printing, across the entire surface may be carried out.

Upon completion of the processing, e.g. the printing process, the processed substrate 2 is removed from the device for further processing by means of the transport device 3 upon releasing the engagement by the supports 7 and the clamping bar 13.

It will be seen that by means of this device not only, as is known per se, comparatively thick substrates 2 may be processed, where the clamping bars 13 apply a clamping force, but also comparatively thin substrates 2, where the clamping bars 13 may apply only a slight clamping force, preferably no clamping force at all, and will essentially only be used for guiding the two oppositely facing lateral edges 11 of the substrate 2, if necessary for aligning them in the case of slightly skew cuts. Depending on the inherent rigidity of the substrate 2, which is essentially dependent on the thickness and material thereof, the position and the number of the supports 7 and in particular their contact area with the bottom surface 9 of the substrate 2 will be determined. In particular, one of the supports 7 may be disposed very closely to the transport device 3 in such a way that it is able to support the substrate 2 in the area of the hold-down 10, i.e. close to the lateral edge area 4.

If necessary, also a transport device 3 deviating from the design according to DE 101 17 873 A1 may be used, in such a way that support devices independent from the actual transport means may be moved in the edge area 4 together with the supports 7 as per the arrow 8.

Here, the substrate 2 having the lowest inherent rigidity will determine the constructional design of such support devices of the transport device 3, such as the number, disposal and contact area of the supports 7.

By contrast, the thickness of the hold-down 10 is determined by the force used for the substrate 2 for compensating any warpages or bend-ups, as they occur in the case of thick substrates, are required [sic]. Thus, if substrates 2 are processed where such warpages and bend-ups do not occur, the hold-down 10 may be formed to be comparatively thin. Also, the clamping bar 13 may be formed in such a way that a clamping force cannot be applied if exclusively thin substrates 2 are to be processed. In this case, the clamping bar 13 is exclusively used as a guide and position retainer during processing.

Since it may well be possible that substrates 2 are cut askew in the longitudinal direction (corresponding to arrow 1), it is expedient if at least one end of the clamping bar 13, preferably in the direction of the arrow 1 at the rear end, is supported in an oscillating manner.

It will be seen that by means of the device designed according to the invention, not just thin substrates 2, but also thick substrates 2 may be processed, in particular printed, where the clamping bar 13 has to apply a clamping force in the direction of arrow 12, as was described at the beginning. It is even possible to control the clamping bar 13 automatically, depending on the substrate 2 supplied in each case, in such a way that it applies a clamping force or not. It is of course also possible to dimension the lifting movement of the supports 7 as per the arrow 8 as a function of the thickness of the substrate 2 in such a way that a contact of the top surface 16 of the substrate 2 with the hold-down 10 is ensured, while any damages are avoided and the movement of the hold-down 10 as per the arrows 14 and 15 remains ensured. This may be done by means of sensor devices acquiring the relevant data, i.e. the type of substrate 2 with regard to the bending stiffness on the one hand or with regard to the thickness on the other hand. It goes without saying that a program controller may also be used for this purpose, and of course a manual adjustment is to be regarded as falling within the scope of the present invention.

It will be seen that also in the case of substrates 2 having a low inherent rigidity, processing, in particular printing, across the entire surface is made possible.

The invention claimed is:

1. A device for processing a flat substrate having a top surface, a bottom surface and two laterally opposite side surfaces, the device comprising:
   a transporting device comprising two lateral edge areas laterally opposite each other, each lateral edge area having a top surface on which the substrate rests for supplying the substrate,
   a plurality of supports each having a top surface operatively contacting the bottom surface of the substrate for moving the substrate upwardly for the purpose of initiating processing,
   a pair of hold-downs, each corresponding to a respective lateral edge area of the transporting device, wherein each hold-down has a bottom surface and the bottom surface of each hold-down is configured to engage the top surface of the substrate upon moving the substrate upwardly by the supports,
   a pair of clamping bars for clamping the two laterally opposite side surfaces of the substrate, when the substrate is pushed against the hold-downs, and
   a controller, which is configured to move each hold-down laterally away from the substrate and the respective clamping bar and further below the area of the top surface of the substrate, such that processing of the entire top surface of the substrate can be carried out.

2. The device as claimed in claim 1, wherein the clamping force of the clamping bar is adjusted in such a way that in the case of substrates having a high bending stiffness, high clamping forces may be applied, and in the case of substrates having a low bending stiffness, low clamping forces or no clamping forces may be applied.

3. The device as claimed in claim 1, wherein each clamping bar is supported in an oscillating manner in the rear area of the clamping bar in the transport direction of the substrate.

4. The device as claimed in claim 1, wherein the number and position of the supports is determined as a function of the stiffness of the substrate in such a manner that the substrate rests flat on the supports even after the hold-downs have been removed.

5. The device as claimed in claim 4, wherein the transport device is aligned in the area of the processing position in such a way that said transport device has support devices which may be moved up and down, and in such a way that the substrate may be moved against the hold-downs in the lateral edge area and upon removal of the hold-downs will lie flat in cooperation with the supports.

6. The device as claimed in claim 1, further comprising means for adjusting the level of the lifting movement of the supports as a function of the thickness of the substrate.

7. The device as claimed in claim 1, further comprising means for adjusting the clamping force of the clamping bar as a function of the inherent rigidity of the substrate are provided.

* * * * *